(12) United States Patent
Tseng et al.

(10) Patent No.: US 11,102,890 B2
(45) Date of Patent: Aug. 24, 2021

(54) ELECTRONIC PACKAGE AND METHOD FOR MANUFACTURING THE SAME

(71) Applicant: Siliconware Precision Industries Co., Ltd., Taichung (TW)

(72) Inventors: Ying-Chang Tseng, Taichung (TW); Yuan-Hung Hsu, Taichung (TW); Chang-Fu Lin, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 154 days.

(21) Appl. No.: 16/201,239

(22) Filed: Nov. 27, 2018

(65) Prior Publication Data

US 2020/0093006 A1    Mar. 19, 2020

(30) Foreign Application Priority Data

Sep. 13, 2018   (TW) .................................. 107132269

(51) Int. Cl.
| | | |
|---|---|---|
| *H01Q 1/22* | (2006.01) | |
| *H01Q 1/38* | (2006.01) | |
| *H05K 3/34* | (2006.01) | |
| *H05K 1/18* | (2006.01) | |

(Continued)

(52) U.S. Cl.
CPC ......... *H05K 3/3436* (2013.01); *H01Q 1/2283* (2013.01); *H01Q 1/38* (2013.01); *H05K 1/181* (2013.01); *H01Q 1/243* (2013.01); *H05K 3/36* (2013.01); *H05K 2201/10545* (2013.01); *H05K 2201/10734* (2013.01)

(58) Field of Classification Search
CPC ................. H05K 3/3436; H05K 1/181; H05K 2201/10545; H05K 2201/10734; H05K 3/36; H05K 2201/10098; H05K 2201/10378; H01Q 1/2283; H01Q 1/38; H01Q 1/243; H01Q 9/0414; H01L 23/13; H01L 23/49816; H01L 23/5383; H01L 23/12; H01L 2224/16225; H01L 2224/32225; H01L 2224/73204; H01L 23/24; H01L 23/66; H01L 21/50; H01L 2223/6677; H01L 2924/10156
See application file for complete search history.

(56) References Cited

U.S. PATENT DOCUMENTS

| | | | | |
|---|---|---|---|---|
| 2012/0119954 | A1* | 5/2012 | Chen ................... | H01Q 21/065 343/700 MS |
| 2012/0280380 | A1* | 11/2012 | Kamgaing .......... | H01Q 1/1271 257/679 |

(Continued)

*Primary Examiner* — Dimary S Lopez Cruz
*Assistant Examiner* — Michael M Bouizza
(74) *Attorney, Agent, or Firm* — Mintz Levin Cohn Ferris Glovsky and Popeo, P.C.; Peter F. Corless; Steven M. Jensen

(57) ABSTRACT

This present disclosure provides an electronic package and a method for manufacturing the same. An antenna board with a limiter is stacked on a circuit board. A support body for holding the antenna board and the circuit board in place is provided between the antenna board and the circuit board, such that in the process of forming the support body, the limiter stops the flow of an adhesive material of the support body, and the adhesive material of the support body is prevented from overflowing onto an antenna structure of the antenna board to make sure that the antenna of the antenna board functions properly.

20 Claims, 4 Drawing Sheets

(51) Int. Cl.
*H01Q 1/24* (2006.01)
*H05K 3/36* (2006.01)

(56) References Cited

U.S. PATENT DOCUMENTS

| | | | | |
|---|---|---|---|---|
| 2015/0041972 A1* | 2/2015 | Shih | ......................... | H01L 25/50 |
| | | | | 257/737 |
| 2019/0206813 A1* | 7/2019 | Kim | ......................... | H01L 24/19 |
| 2019/0305402 A1* | 10/2019 | Dalmia | ................ | H01Q 9/0471 |

* cited by examiner

ELECTRONIC PACKAGE AND METHOD FOR MANUFACTURING THE SAME

CROSS-REFERENCE TO RELATED APPLICATION

This Application claims under 35 U.S.C. § 119(a) the benefit of Taiwanese Patent Application No. 107132269 filed on Sep. 13, 2018. The entire contents of these applications are incorporated herein by reference in their entirety.

BACKGROUND

1. Technical Field

The present disclosure relates to electronic packages, and, more particularly, to an electronic package having an antenna structure.

2. Description of Related Art

Wireless communication technologies have been widely adopted in a myriad of consumer electronic products for receiving and/or transmitting various wireless signals. In order to satisfy the physical designs of the consumer electronic products, wireless communication modules are being designed and manufactured with compactness and light weight in mind. Among them, a patch antenna is widely used in the wireless communication modules of electronic products, such as cell phones, due to its small size, light weight and ease of manufacturing.

As shown in FIG. 1, a cross-sectional diagram of a traditional wireless communication module 1 is shown. The wireless communication module 1 includes a circuit board 10 provided with a semiconductor chip 11 on a bottom side thereof. A substrate 12 having an antenna (not shown) is stacked on a top side of the circuit board 10 via a plurality of solder bumps 18. The circuit board 10 includes a ground plate (not shown) and antenna feed lines (not shown). A plurality of solder balls 19 are also disposed on the bottom side of the circuit board 10. A vacant area between the circuit board 10 and the substrate 12 needs to be defined (an area surrounded by the solder bumps 18 in which no glue or molding compound should occupy). A distance L between the circuit board 10 and the substrate 12 also needs to be controlled to ensure the quality of the transmission signals between the substrate 12 and the semiconductor chip 11.

However, in the traditional wireless communication module 1 when the substrate 12 is stacked on top of the circuit board 10, the overall structure is flipped over (FIG. 1 can be seen inverted) for the solder balls 19 to be reflowed accordingly. At the same time, the solder bumps 18 are softened and pulled down by the substrate 12 due to gravity, resulting in a larger distance L between the circuit board 10 and the substrate 12 and affecting the antenna function of the substrate 12. This may decrease the product yield.

Therefore, there is an urgent need to find a solution that overcomes the aforementioned problems in the prior art.

SUMMARY

In view of the foregoing shortcomings in the prior art, the present disclosure provides an electronic package, which may include: a first substrate including an antenna structure and at least one limiter provided at an edge of the first substrate; a second substrate including one or more circuit layers, the first substrate being stacked on top of the second substrate via a plurality of conductive components; and at least a support body provided between the first substrate and the second substrate and extending to be in contact with the limiter to hold the first substrate and the second substrate in place, wherein the support body is not electrically connected with the first substrate and the second substrate.

The present disclosure further provides a method for manufacturing an electronic package, which may include the following steps of: providing a first substrate including an antenna structure and at least one limiter provided at an edge of the first substrate; stacking the first substrate on top of a second substrate having circuit layers via a plurality of conductive components; and providing at least a support body between the first substrate and the second substrate, wherein the support body extends to be in contact with the limiter to hold the first substrate and the second substrate in place, and the support body is not electrically connected with the first substrate and the second substrate.

In an embodiment, the first substrate is defined with a first surface, a second surface opposite to the first surface, and side faces adjoining the first and second surfaces, with at least one notch interconnecting the first surface with the second surface to be formed in side faces of the first substrate, and a wall of the notch being stepped to be served as the limiter.

In an embodiment, the first substrate is defined with a first surface, a second surface opposite to the first surface, and side faces adjoining the first and second surfaces, with at least one notch interconnecting the first surface with the second surface to be formed in side faces of the first substrate, and the support body being engaged in the notch.

In an embodiment, an insulating protective layer is formed on a surface of the first substrate and is stepped to be served as the limiter.

In an embodiment, a bump is provided on a surface of the first substrate to be served as the limiter.

In an embodiment, the support body protrudes from a side face of the first substrate. In an embodiment, forming the support body includes: dispensing an adhesive between the first substrate and the second substrate for the adhesive to be in contact with the first substrate and the second substrate; and curing the adhesive to form the support body. In an embodiment, the support body is a thermosetting adhesive.

In an embodiment, an electronic component is further provided on the second substrate.

In an embodiment, the second substrate includes a first side and a second side opposite to the first side, with the first substrate stacked on the first side of the second substrate and the electronic component provided on the second side of the second substrate.

In an embodiment, the second substrate further includes an antenna portion in communication with the antenna structure through electromagnetic induction.

In an embodiment, the first substrate is narrower than the second substrate.

In summary, through the arrangement of the one or more support bodies, the electronic package and the method for manufacturing the same according to the present disclosure allow the distance between the first substrate and the second substrate to be kept unchanged even after a high-temperature manufacturing process is performed. Therefore, compared to the prior art, the electronic package in accordance with the present disclosure has the functions of its antenna structure without being compromised as a result of the increase in the distance between the first and second substrates, thereby preventing lowered product yield.

BRIEF DESCRIPTION OF THE DRAWINGS

FIG. 2A' is a top view of a first substrate in FIG. 2A.

DETAILED DESCRIPTION OF THE EMBODIMENTS

Figure 1:
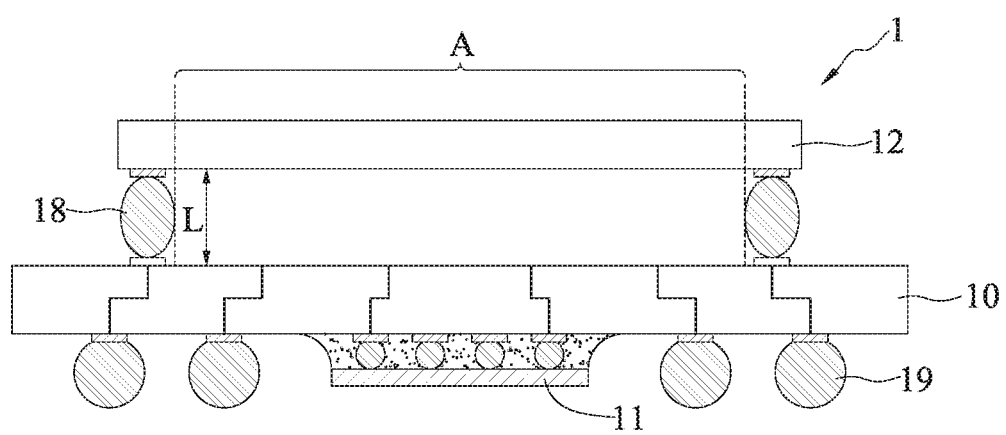
FIG. 1 is a schematic cross-sectional view of a conventional wireless communication module.

The present disclosure is described by the following specific embodiments. Those with ordinary skills in the arts can readily understand other advantages and functions of the present disclosure after reading the disclosure of this specification. The present disclosure may also be practiced or applied with other different implementations. Based on different contexts and applications, the various details in this specification can be modified and changed without departing from the spirit of the present disclosure.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the present disclosure, and therefore have no substantial technical meaning. Without affecting the effects created and objectives achieved by the present disclosure, any modifications, changes or adjustments to the structures, ratio relationships or sizes, are to be construed as fall within the range covered by the technical contents disclosed herein. Meanwhile, terms, such as "first", "second", "a", "one" and the like, are for illustrative purposes only, and are not meant to limit the range implementable by the present disclosure. Any changes or adjustments made to their relative relationships, without modifying the substantial technical contents, are also to be construed as within the range implementable by the present disclosure.

Figure 2A:
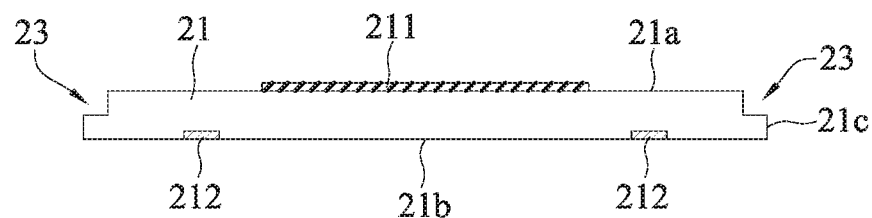
FIGS. 2A to 2C are schematic cross-sectional views of an electronic package in accordance with the present disclosure.
Figure 2A:
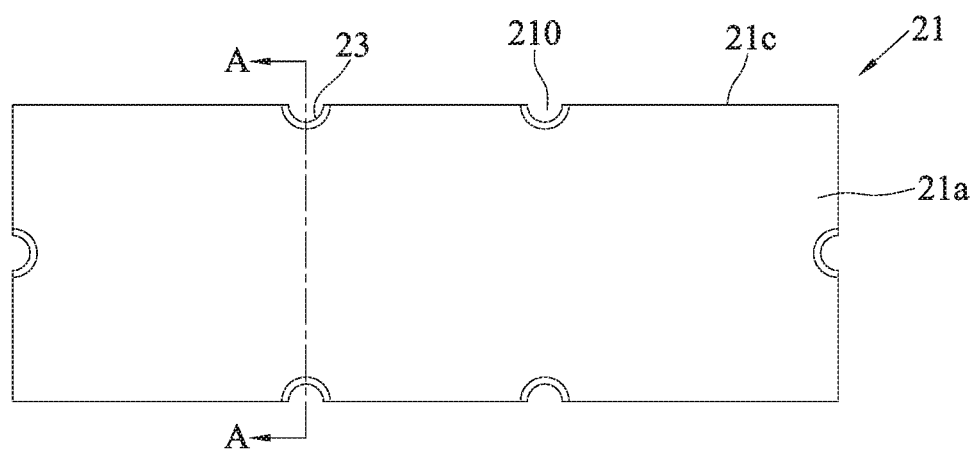
Figure 2B:
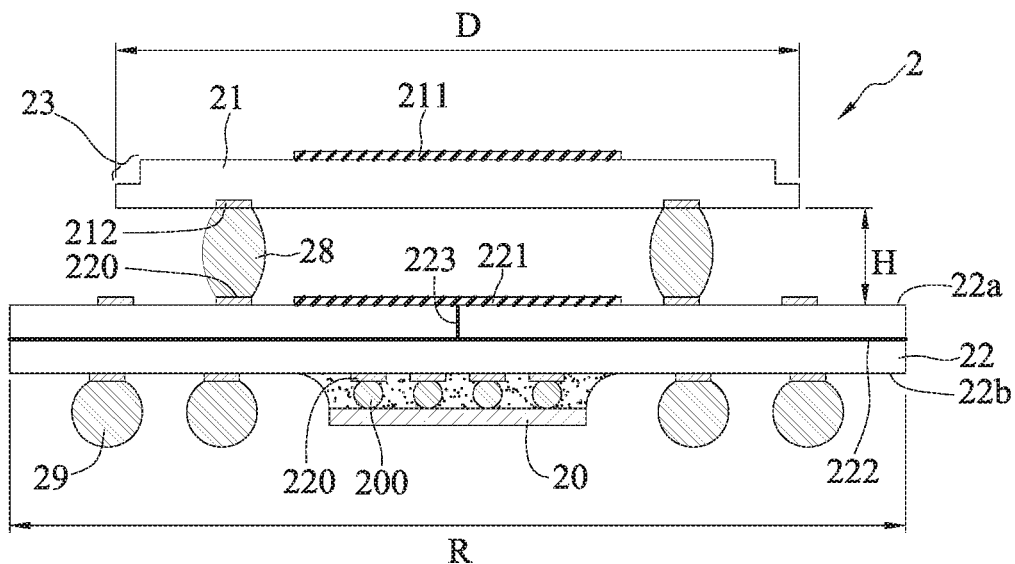
Figure 2C:
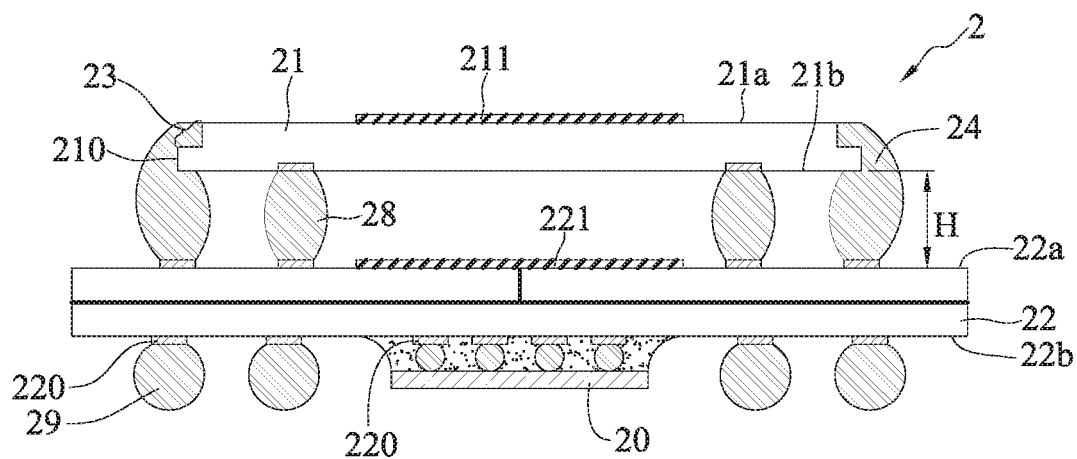

FIGS. 2A to 2C are schematic cross-sectional views illustrating a method for manufacturing an electronic package 2 in accordance with the present disclosure. FIG. 2A is a cross-sectional view of FIG. 2A' along a section line A-A.

As shown in FIG. 2A, a first substrate 21 is provided, which includes a first surface 21a, a second surface 21b opposite to the first surface 21a, and side faces 21c adjoining the first and second surfaces 21a and 21b. A plurality of limiters 23 are provided at the edges of the first substrate 21.

In an embodiment, the first substrate 21 is an antenna board having at least an antenna structure 211 provided on the first surface 21a and a plurality of conductive contacts 212 provided on the second surface 21b. The antenna structure 211 is a circuit-type antenna and is electrically insulated from the conductive contacts 21. It can be appreciated that the first substrate 21 can also be other types of antenna board, and the present disclosure is not limited to any specific type of antenna board.

The side faces 21 of the first substrate 21 have at least one notch 210, such as those semi-circular holes shown in FIG. 2A', interconnecting the first and second surfaces 21a and 21b. The wall of the notch 210 is stepped to be served as a limiter 23 (referring to FIG. 3A). For example, a larger hole is first formed on the first surface 21a of the first substrate 21. The larger hole is not interconnected with the second surface 21b. Then a smaller hole interconnected with the second surface 21b is formed on the bottom of the larger hole, such that the larger hole and the smaller hole form the notch 210. The stepped wall of the notch 210 serves as the limiter 23. It can be appreciated that multiple tiers of stepped walls can be formed according to needs. In other words, holes with incrementally smaller apertures can be sequentially formed.

Figure 3A:
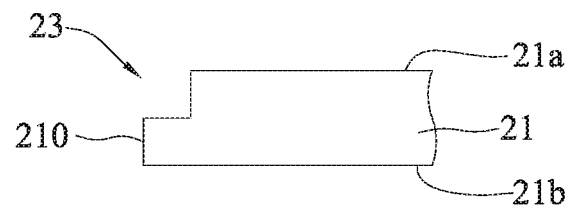
FIGS. 3A to 3C are partially enlarged views of FIG. 2A in accordance with different embodiments of the present disclosure.
Figure 3B:
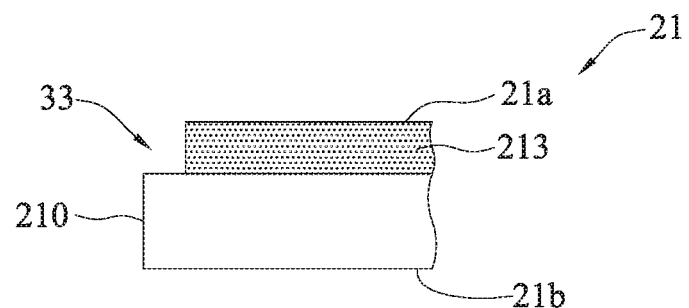

As an alternative, as shown in FIG. 3B, an edge of an insulating protective layer 213 on the first surface 21a of the first substrate 21 can be stepped to form a limiter 33. It can be appreciated that multiple tiers can be formed on the edge of the insulating protective layer 21 according to practical needs.

Figure 3C:
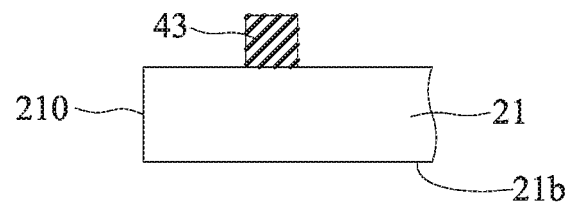

As another alternative, as shown in FIG. 3C, a dam can be formed on the first surface 21a of the first substrate 21 to be served as a limiter 43. The limiter 43 can be, for example, a metal bump or an insulating bump that protrudes from the first substrate 21 of the first substrate 21.

It can be appreciated that the aspects of the notch 210 and the limiters 23, 33, 43 can be designed according to needs, and are not limited to the above.

As shown in FIG. 2B, the first substrate 21 is stacked, via its second surface 21b, on the top of a second substrate 22 through a plurality of conductive components 28. The width D of the first substrate 21 is less than the width R of the second substrate 22, and a vacant area between the first substrate 21 and the second substrate 22 needs to be defined (an area surrounded by the conductive components 28 in which no glue or molding compound should occupy).

In an embodiment, the second substrate 22 is a circuit board defined with a first side 22a and a second side 22b opposite to the first side 22a. The first substrate 21 is stacked on the first side 22a of the second substrate 22. In an embodiment, the second substrate 22 includes circuit layers 220, an antenna portion 221, a ground layer 222, and antenna feed lines 223. In another embodiment, the antenna portion 221 is a circuit-type antenna that is electrically connected to the ground layer 222 via the antenna feed lines, but is electrically insulated from the circuit layers 220. The antenna structure 211 of the first substrate 21 may interact with the antenna portion 221 of the second substrate 22 through electromagnetic induction, thereby transmitting signals between the two.

In an embodiment, the conductive components 28 are bonded between the conductive contacts 21 of the first substrate 21 and the circuit layer 220 on the first side 22a of the second substrate 22 for electrically connecting the first substrate 21 with the second substrate 22. In an embodiment, the conductive components 28 are copper pillars, soldering materials or other structures, and the present disclosure is not limited thereto.

In an embodiment, the conductive components 28 are not electrically connected to the antenna structure 211 and the antenna portion 221. Some of the conductive components 28 can be electrically connected to the ground layer 222 or dummy pads. The conductive contacts 21 and the contacts of the circuit layer 220 may serve as dummy pads without any electrical functions.

In an embodiment, at least an electronic component 20 can be provided on the second side 22b of the second substrate 22. In another embodiment, the electronic component 20 is an active component, a passive component or a combination of both. The active component can be, for example, a semiconductor chip, and the passive component can be, for example, a resistor, a capacitor, an inductor or the like. In an embodiment, the electronic component 20 can be electrically connected to the circuit layer 220 via a plurality of conductive bumps 200 (e.g., soldering materials) in a flip-chip manner. Alternatively, the electronic component 20 can be bonded to the circuit layer 220 in a wired manner via a plurality of soldering wires (not shown). As another alternative, the electronic component 20 can be made to be in contact and electrically connected with the circuit layer 220 directly. Nevertheless, how the electronic component 20 is electrically connected with the second substrate 22 is not limited to those described above. It can be appreciated that, although the electronic component 20 is shown not provided between the first substrate 21 and the second substrate 22, there are numerous ways in which the electronic component 20 can be arranged (e.g., on the first side 22a of the second substrate 22), and the present disclosure is not limited as such.

As shown in FIG. 2C, support bodies 24 are formed between the second surface 21b of the first substrate 21 and the first side 22a of the second substrate 22 via the notches 210 to hold the first substrate 21 and the second substrate 22 in place. The support bodies 24 are not electrically connected with the first and second substrates 21 and 22.

In an embodiment, the support bodies 24 are insulating materials, such as adhesive pillars, and are exposed from the notches 210 or the first surface 21a of the first substrate 21.

In an embodiment, the process of forming the support bodies 24 includes dispensing a thermosetting adhesive between the first substrate 21 and the second substrate 22 via the notches 210 by a dispense needle, such that the adhesive is in contact with the first surface 21a of the first substrate 21 and the first side 22a of the second substrate 22 (also may be in contact with the walls of the notches 210 or the limiters 23). The thermosetting adhesive is then cured to form the support bodies 24.

In an embodiment, the notch 210 has a semi-circular shape as shown in FIG. 3A, and a larger dispense needle can be used in forming the support bodies 24 to reduce cost.

In an embodiment, the support bodies 24 may protrude from the side faces 21 of the first substrate 21 or may not protrude from the side faces 21 of the first substrate 21 (only occupy the notches 210).

In an embodiment, a plurality of solder balls 29 can be disposed on the circuit layer 220 on the second side 22b of the second substrate 22, and are reflowed so as to be bonded with an electronic device (not shown), such as another circuit board.

The method for manufacturing an electronic package in accordance with the present disclosure allows coupling of the first substrate 21 and the second substrate 22 through the support bodies 24, such that the distance H between the first substrate 21 and the second substrate 22 can be kept unchanged. This prevents the conductive components 28 from being pulled down by the weight of the first substrate 21 during the reflow of the solder balls 29 or a subsequent high-temperature baking process. Therefore, compared to the prior art, the electronic package 2 in accordance with the present disclosure is able to keep constant the distance H between the first substrate 21 and the second substrate 22, such that the antenna structure 211 and the antenna portion 221 can function normally and the quality of the antenna can be effectively controlled, thereby improving the product yield.

With the design of the limiters 23, 33, 43 being located closer to the side faces 21 of the first substrate 21 than the antenna structure 211, the support bodies 24 during forming may extend into and make contact with the limiters 23, 33, 43, and are trapped around the limiters 23, 33, 43. As a result, the support bodies 24 are prevented from overflowing onto the antenna structure 211, ensuring the integrity of the antenna structure 211 on the first substrate 21, thereby improving the product yield.

With the design of the notches 210, during formation of the support bodies 24, the bonding between the support bodies 24 and the first substrate 21 can be strengthened by the portion of the support bodies 24 formed inside the notches 210, preventing undesirable detachment of the support bodies 24 from the first substrate 21.

The present disclosure provides an electronic package 2, which includes: a first substrate 21, a second substrate 22 and at least one support body 24.

The first substrate 21 includes an antenna structure 211 and a limiter 23 provided at an edge of the first substrate 21.

The second substrate 22 includes circuit layers 220, and the first substrate 21 is stacked on top of the second substrate 22 via a plurality of conductive components 28.

The support body 24 is provided between the first substrate 21 and the second substrate 22 and extends into and makes contact with the limiter 23, such that the support body 24 holds the first substrate 21 and the second substrate 22 in place. The support body 24 is not electrically connected with the first substrate 21 and the second substrate 22.

In an embodiment, the first substrate 21 is defined with a first surface 21a, a second surface 21b opposite to the first surface 21a, and side faces 21 adjoining the first and second surfaces 21a and 21b. The side faces 21 of the first substrate 21 includes at least one notch 210 interconnecting the first surface 21a with the second surface 21b, and the wall of the notch 210 is stepped to be served as the limiter 23. The support body 24 is engaged in the notch 210.

In an embodiment, an insulating protective layer 21 is provided on the first surface 21a of the first substrate 21, and an edge of the insulating protective layer 21 is stepped to be served as a limiter 33.

In an embodiment, a protruding bump is provided on the first surface 21a of the first substrate 21 to be served as a limiter 43.

In an embodiment, the support body 24 protrudes from the side face 21 of the first substrate 21.

In an embodiment, the support body 24 is a thermosetting adhesive.

In an embodiment, the electronic package 2 further includes an electronic component 20 provided on the second substrate 22. In another embodiment, the second substrate 22 includes a first side 22a and a second side 22b opposite to the first side 22a, and the first substrate 21 is stacked on the first side 22a of the second substrate 22, while the electronic component 20 is provided on the second side 22b of the second substrate 22.

In an embodiment, the second substrate 22 further includes an antenna portion 221 that can be interact with the antenna structure 211 through electromagnetic induction.

In summary, the electronic package and the method for manufacturing the same according to the present disclosure keep the distance between the first substrate and the second substrate unchanged by the arrangement of the one or more support bodies even after a high-temperature manufacturing process is performed. As a result, the antenna structure will be able to function properly in the electronic package in accordance with the present disclosure, thus ensuring the product yield is line with expectations.

The above embodiments are only used to illustrate the principles of the present disclosure, and should not be construed as to limit the present disclosure in any way. The above embodiments can be modified by those with ordinary skill in the art without departing from the scope of the present disclosure as defined in the following appended claims.

What is claimed is:

1. An electronic package, comprising:
a first substrate including an antenna structure and at least one limiter provided at an edge of the first substrate, wherein the first substrate is defined with a first surface, a second surface opposite to the first surface, and side faces adjoining the first surface and the second surface, with at least one notch interconnecting the first surface with the second surface to be formed on the side faces of the first substrate, and a wall of the notch being stepped to serve as the limiter;
a second substrate including one or more circuit layers, the first substrate being stacked on top of the second substrate via a plurality of conductive components; and
at least a support body formed between the first substrate and the second substrate and extending to be in contact with the limiter to hold the first substrate and the second substrate in place, wherein the support body is free from being electrically connected with the first substrate and the second substrate.

2. The electronic package of claim 1, wherein the support body is engaged in the notch.

3. The electronic package of claim 1, wherein the first substrate has an insulating protective layer that serves as the first surface of the first substrate.

4. The electronic package of claim 1, wherein the first substrate has a bump provided on the first surface of the first substrate and along an edge of the notch.

5. The electronic package of claim 1, wherein the support body protrudes from a side face of the first substrate.

6. The electronic package of claim 1, wherein the support body is formed by a thermosetting adhesive.

7. The electronic package of claim 1, further comprising an electronic component provided on the second substrate.

8. The electronic package of claim 7, wherein the second substrate includes a first side and a second side opposite to the first side, with the first substrate stacked on the first side of the second substrate and the electronic component provided on the second side of the second substrate.

9. The electronic package of claim 1, wherein the second substrate further includes an antenna portion in communication with the antenna structure through electromagnetic induction.

10. The electronic package of claim 1, wherein the first substrate is narrower than the second substrate.

11. A method for manufacturing an electronic package, comprising:
providing a first substrate including an antenna structure and at least one limiter provided at an edge of the first substrate, wherein the first substrate is defined with a first surface, a second surface opposite to the first surface, and side faces adjoining the first surface and the second surface, with at least one notch interconnecting the first surface with the second surface to be formed on the side faces of the first substrate, and a wall of the notch being stepped to serve as the limiter;
stacking the first substrate on top of a second substrate having circuit layers via a plurality of conductive components; and
forming between the first substrate and the second substrate at least a support body extending to be in contact with the limiter to hold the first substrate and the second substrate in place, wherein the support body is free from being electrically connected with the first substrate and the second substrate.

12. The method of claim 11, wherein the support body is engaged in the notch.

13. The method of claim 11, wherein the first substrate has an insulating protective layer that serves as the first surface of the first substrate.

14. The method of claim 11, wherein the first substrate has a bump provided on the first surface of the first substrate and along an edge of the notch.

15. The method of claim 11, wherein the support body protrudes from a side face of the first substrate, and the support body is formed by a thermosetting adhesive.

16. The method of claim 11, wherein forming the support body includes:
dispensing the thermosetting adhesive between the first substrate and the second substrate for the thermosetting adhesive to be in contact with the first substrate and the second substrate; and
curing the thermosetting adhesive to form the support body.

17. The method of claim 11, further comprising providing an electronic component on the second substrate.

18. The method of claim 17, wherein the second substrate includes a first side and a second side opposite to the first side, with the first substrate stacked on the first side of the second substrate and the electronic component provided on the second side of the second substrate.

19. The method of claim 11, wherein the second substrate further includes an antenna portion in communication with the antenna structure through electromagnetic induction.

20. The method of claim 11, wherein the first substrate is narrower than the second substrate.

* * * * *